United States Patent
Kumar et al.

(10) Patent No.: US 8,803,572 B2
(45) Date of Patent: Aug. 12, 2014

(54) PHASE LOCKED LOOP CIRCUIT WITH REDUCED JITTER

(75) Inventors: Anand Kumar, Noida (IN); Pradeep Dhadda, Greater Noida (IN)

(73) Assignee: STMicroelectronics International N.V., Amsterdam (NL)

(*) Notice: Subject to any disclaimer, the term of this patent is extended or adjusted under 35 U.S.C. 154(b) by 22 days.

(21) Appl. No.: 13/547,742

(22) Filed: Jul. 12, 2012

(65) Prior Publication Data

US 2014/0015577 A1    Jan. 16, 2014

(51) Int. Cl.
*H03L 7/06* (2006.01)

(52) U.S. Cl.
USPC .......................................... 327/156; 327/147

(58) Field of Classification Search
None
See application file for complete search history.

(56) References Cited

U.S. PATENT DOCUMENTS

| | | | | |
|---|---|---|---|---|
| 5,406,592 A * | 4/1995 | Baumert | ..................... | 375/376 |
| 6,385,265 B1 * | 5/2002 | Duffy et al. | .................... | 375/374 |
| 6,434,206 B1 * | 8/2002 | Yu | ................................. | 375/376 |
| 6,538,516 B2 * | 3/2003 | Lenk | ................................. | 331/2 |
| 7,705,640 B2 * | 4/2010 | Clements et al. | ............. | 327/157 |
| 2010/0052746 A1 * | 3/2010 | Park et al. | ......................... | 327/156 |
| 2011/0006820 A1 * | 1/2011 | Liu et al. | ......................... | 327/157 |
| 2011/0215848 A1 * | 9/2011 | Koroglu et al. | ............... | 327/157 |
| 2011/0228888 A1 * | 9/2011 | Gelter et al. | .................. | 375/371 |
| 2012/0038402 A1 * | 2/2012 | Takahashi | ..................... | 327/157 |

* cited by examiner

*Primary Examiner* — Cassandra Cox

(74) *Attorney, Agent, or Firm* — Graybeal Jackson LLP

(57) ABSTRACT

A system and method for providing a phase-locked loop that reduces the effects of jitter caused by thermal noise of a resistor in a low-pass filter in the PLL. Thermal noise from various electronic components may cause unwanted jitter is a PLL. The size of various components in the filter are typically set to specific sizes to realize a transfer function suited for loop stability and reduction in phase jitter. In one embodiment, the jitter due to thermal noise in the resistor may be reduced by reducing the size of the gain affecting the signal through this resistor. By adjusting the size of the resistor by a scaling factor as well as other components in the PLL, one may then control a voltage controlled oscillator (VCO) using two or more control signals through the LPF.

25 Claims, 3 Drawing Sheets

PHASE LOCKED LOOP CIRCUIT WITH REDUCED JITTER

BACKGROUND

Electronic devices of all kinds employ use of phase locked loops (sometimes called phase lock loops) for manipulating electronic signals. A phase-locked loop (PLL) is a control system that generates an output signal having a phase and frequency that is related to the phase and frequency of an input signal (often called a reference signal). The circuit compares the phase of the input signal with the phase of the signal at the output and adjusts the frequency of an oscillator to keep the phase of the generated output signal matched to the phase of the input signal. By keeping the phases of these signals locked to each other, one can be assured that the frequency of the output signal also matches the frequency (or an integer multiple thereof) of the input signal.

Keeping the input and output signals locked in to the same frequency allows for higher and higher speed signal processing and communication to occur. PLL circuits are widely employed in radio, telecommunications, computers and other electronic applications. In various applications, a PLL circuit may be used to recover a signal from a noisy communication channel, generate stable frequencies at a multiple of an input frequency (frequency synthesis), or distribute clock timing pulses in digital logic designs such as microprocessors. Since a single integrated circuit can provide a complete PLL circuit, the technique is widely used in modern electronic devices, with output frequencies from a fraction of a hertz up to many gigahertz.

As PLL circuits are called upon to be employed in devices having faster speed requirements and having lower power supply voltages, electronic noise, such as thermal noise, becomes a larger factor affecting jitter in the PLL.

BRIEF DESCRIPTION OF THE DRAWINGS

Aspects and many of the attendant advantages of the claims will become more readily appreciated as the same become better understood by reference to the following detailed description, when taken in conjunction with the accompanying drawings, wherein:

DETAILED DESCRIPTION

The following discussion is presented to enable a person skilled in the art to make and use the subject matter disclosed herein. The general principles described herein may be applied to embodiments and applications other than those detailed above without departing from the spirit and scope of the present detailed description. The present disclosure is not intended to be limited to the embodiments shown, but is to be accorded the widest scope consistent with the principles and features disclosed or suggested herein.

By way of overview, the subject matter disclosed herein may be directed to a system and method for providing a PLL that reduces the effects of jitter caused by thermal noise of a resistor in a low-pass filter (LPF) in the PLL. Thermal noise from various electronic components may cause unwanted jitter is a PLL. The size of various capacitors and resistors in a LPF are typically set to specific sizes to realize a transfer function suited for loop stability and reduction in phase jitter. As PLL circuits are called upon to be employed in devices having faster speed requirements and having lower power supply voltages, electronic noise, such as thermal noise, becomes a larger factor affecting jitter in the PLL. In various embodiments discussed herein, this jitter due to thermal noise in the resistor may be reduced by reducing the size of the gain affecting the signal through this resistor. By adjusting the size of the resistor by a scaling factor as well as other components in the PLL, one may then control a voltage controlled oscillator (VCO) using two or more control signals through the LPF.

In one embodiment, the resistor is increased by a scaling factor of five. In turn, an associated capacitor is reduced by the scaling factor of five. Then, a first control signal may be routed to a gain stage in the VCO that is also reduced by the scaling factor of five. In order to maintain the transfer function for the purposes of the loop function, a second control signal from the LPF may be coupled to a second gain stage having a related gain suited to compensate for the reduction in the initial gain stage. These and other embodiments are discussed in greater detail below with respect to FIGS. 1-5.

Figure 1:
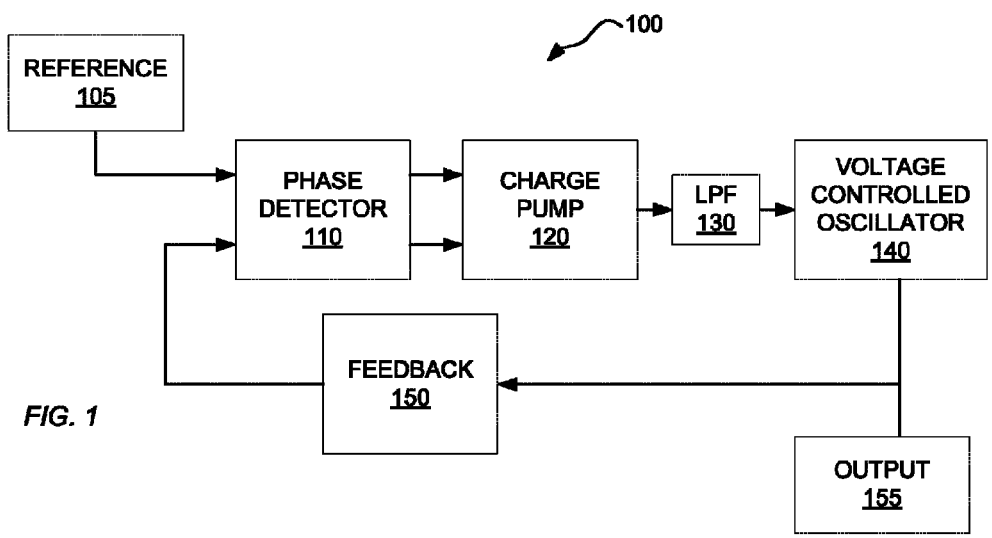
FIG. 1 is a block diagram of a phase locked loop circuit according to an embodiment of the subject matter disclosed herein.

FIG. 1 is a block diagram of a PLL 100 according to an embodiment of the subject matter disclosed herein. The PLL of FIG. 1 shows several common components in a digital PLL circuit. The PLL in FIG. 1 may also be an analog PLL, but the aspects of an analog PLL will not be discussed in detail as the descriptions discussed below with the remainder of this disclosure apply equally to analog PLLs as well. The PLL 100 includes a phase detector 110 (coupled to a signal input 105), a charge pump 120, a low-pass filter 130, a voltage-controlled oscillator 140 (coupled to a signal output 155), and a feedback path 150.

When in operation, the phase detector 110 compares two input signals (a feedback signal from feedback path 150 and an input signal referred to hereinafter as a reference signal 105) and produces one of two signals, often simply called an up signal and a down signal. The phase detector 110 outputs a phase-indicator up signal and a phase-indicator down signal, which are used to control a charge pump 120. Typically, the charge pump 120 includes a high-side leg (referred to a power supply voltage+Vdd) and a low-side leg (referred to ground). The high-side leg consists of a current generator (not shown), which is connected in series to an electronic switch for output. Likewise, the low-side leg consists of a current generator (also not shown), which is connected in series to another electronic switch for output as well. The electronic switches are controlled by the up-signal and by the down-signal, respectively. The high-side leg and the low-side leg are connected to each other, and define an output node of the charge pump 120 that supplies a current to the low-pass filter 130. The time during which various switches are turned on is proportional to the determined phase difference. Thus, the output of the charge pump 120 (called an error signal) is also dependent on the phase difference.

The current signal output from the charge pump 120 is coupled to a filter 130. The filter 130 provides stability on the loop dynamics. Because a feedback path 150 exists, the filter 130 keeps the PLL circuit 100 from destabilizing at various error conditions due to minute error detections. Common considerations are the range over which the loop can achieve lock (pull-in range, lock range or capture range), how fast the loop achieves lock (lock time, lock-up time or settling time) and damping behavior. Depending on the application, this may require one or more of the following: a simple proportion (gain or attenuation), an integral (low pass filter) and/or derivative (high pass filter).

In the following embodiments, the filter 130 is a low-pass filter (LPF). A LPF 130 may also limit the amount of reference frequency energy (ripple) appearing at the phase detector 110 output. The low pass characteristic of the LPF 130 can be used to attenuate this energy. Depending on the specific goals in which the PLL circuit 100 is attempting to achieve, the LPF 130 may include components suited to provide more stability or more ripple attenuation. Aspects of this block are discussed in greater detail in FIGS. 2-4 below.

The filtered voltage signal is then fed to a voltage controlled oscillator (VCO) 140. The VCO 140 generates a periodic output signal (at output 155) that is based on the input current signal. If one assumes that, initially, the VCO 140 is set to nearly the same frequency as the reference signal, then small adjustments through the feedback signal may keep the phases locked to within a desired threshold. If the phase from the VCO 140 is determined to be behind that of the reference signal 105, the phase detector 110 adjusts the control voltage signal to the VCO 140 so that it speeds up. Likewise, if the phase from the VCO 140 is determined to be ahead of the reference signal 105, the phase detector 110 adjusts the control voltage signal to slow down the VCO 140.

This output signal is also sent through a feedback path 150 to provide feedback control for the PLL 100. The feedback path 150 may be a frequency divider in order to make the PLL's output signal frequency a multiple of the reference signal 105 frequency. A non-integer multiple of the reference frequency can also be created by replacing the simple divide-by-N counter in the feedback path 150 with a programmable pulse swallowing counter. This technique is usually referred to as a fractional-N synthesizer or fractional-N PLL.

A skilled artisan understands that the feedback path 150 not limited to a frequency divider. For the purposes of the embodiments discussed herein, the VCO 140 in conjunction with the LPF 130 may be modeled as one or more transfer functions (as discussed below) for receiving the current control signal from the charge pump 120 and producing an output signal at the output 155.

With the PLL 100 of FIG. 1, a skilled artisan may tailor various aspects of these functional blocks to suit specific needs for specific applications that utilize a PLL circuit. In the following embodiments, the LPF 130 and the VCO 140 may include different components coupled together in various manners for achieving these different goals as discussed below.

Figure 2:
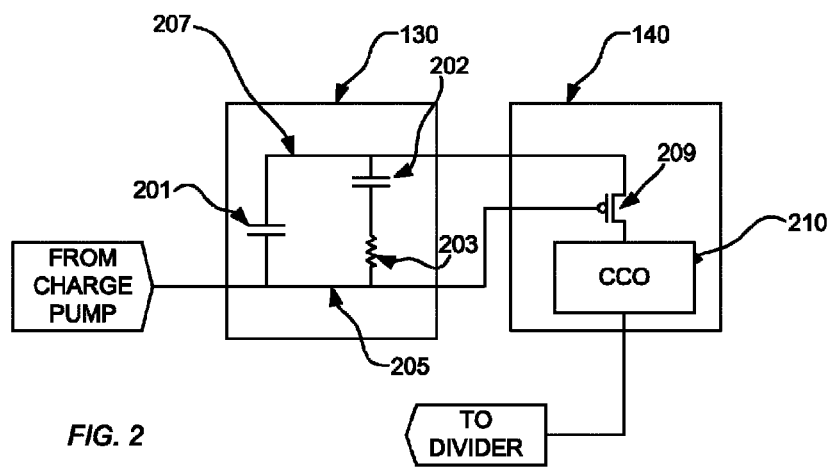
FIG. 2 is a circuit diagram of a low pass filter circuit and VCO from FIG. 1 of a phase locked loop circuit.

FIG. 2 is a circuit diagram of the low pass filter 130 and the VCO 140 from FIG. 1 of a PLL 100 as shown in FIG. 1. In FIG. 2, one goal of the LPF 130 is to provide stability in the PLL 100 along with a filtering of phase jitter that may be present in the reference signal 105. In this embodiment, the LPF 130, a simple low-pass filter is shown with two branches in parallel. The branches are coupled between a signal node 205 from the charge pump 120 (shown in FIG. 1) and a reference node 207. The left branch includes a first capacitor 201 and the right branch includes a second capacitor 202 in series with a resistor 203. Further, the second branch has the resistor 203 coupled to the signal node 205 and the second capacitor 202 coupled to the reference node 207. These components may be sized to provide typical stability and ripple filtering for the PLL 100. In one example, the first capacitor 201 is 20 pF, the second capacitor 202 is 200 pF and the resistor 203 is 2000 ohms. The reference node 207 may be referred to as the common node (supply or ground or some other common voltage, for example) for the LPF 130 and VCO 140. The signal node 205 is connected to the charge pump 120 output as well as to a voltage-to-current converter 209 in the VCO 140. This voltage-to-current converter 209 includes a control node coupled to the signal node 205 of the LPF 130. The voltage to current converter 209 also includes a first conduction node coupled to the common node 207 and a second conduction node coupled to a current-controlled oscillator (CCO) 210 in the VCO 140. The output of the VCO 140 is coupled to the feedback stage 150 (shown in FIG. 1). Of course, a skilled artisan understands that these values may be tailored to suit specific needs for a specific application. Further, the loop filter is not limited to $2^{nd}$ order low pass filter as additional types of filters with higher orders and different electronic components may be realized to suit specific needs.

In a low pass filter 130 having the first capacitor 201 (with a value of C2) in parallel with the second capacitor 202 (having a value of C1) and resistor 203 (having a value of R1), one may model the initial low pass filter 130 transfer function H(s) as:

$$H(s)=(1/sC2)\|(R1+1/sC1)=(1+sR1C1)/(s(C1+C2+sR1C1C2)).$$

Adding in a gain from the VCO 140 of K, the transfer function becomes:

$$H(s)=(1+sR1C1)/(s(C1+C2+sR1C1C2))*K.$$

The LPF 130 and VCO 140 as shown in FIG. 2, however, include drawbacks due to jitter. In all PLL circuits, jitter may be a problem to be addressed in order to ensure operation of the PLL circuit. Jitter is the undesired deviation from true periodicity of an assumed periodic signal in electronics and telecommunications, often in relation to a reference clock source. Jitter may be observed in characteristics such as the frequency of successive pulses, the signal amplitude, or phase of periodic signals. Jitter is a significant, and usually undesired, factor in the design of almost all PLL circuits.

Jitter may be caused by a number of different phenomenon. For example, electromagnetic interference (EMI) and crosstalk with carriers of other signals may cause jitter. One specific cause of jitter that is a concern for the embodiments discussed herein is thermal noise of the resistor 203 in LPF 130. Thermal noise is present in all active and passive elements. The signal at the signal node 205 has thermal noise components due to the resistor 203 in LPF 130. This noise along with the voltage signal on signal node 205 gets amplified by the VCO 140, (e.g., by the gain (K)) One may approximate the contribution of thermal jitter as: $V_n^2=4kTR$, where k is Boltzmann Constant (1.38e−23 J/K), T is Absolute temperature in Kelvin.

Figure 3:
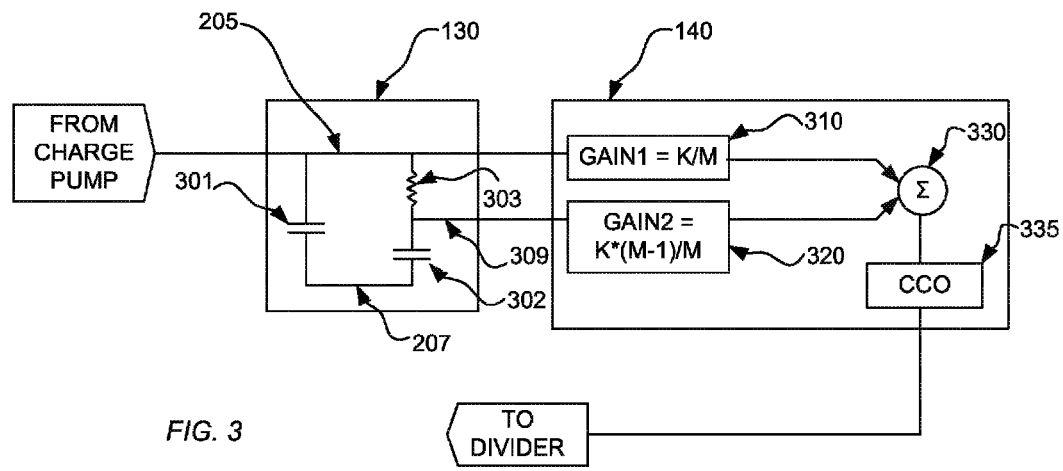
FIG. 3 is a circuit diagram of a low pass filter and VCO from FIG. 1 of a phase locked loop circuit having an effect of reduced jitter due to thermal noise of resistor in the low pass filter according to an embodiment of the subject matter disclosed herein.

In the following embodiments as shown in FIG. 3, the jitter due to thermal noise of the resistor 203 is reduced by coupling an additional node in the LPF 130 to an additional voltage to current converter in the VCO 140.

FIG. 3 is a circuit diagram of a LPF 130 from FIG. 1 of a PLL having an effect of reduced jitter due to thermal noise of the resistor in LPF according to an embodiment of the subject matter disclosed herein. In the embodiment of FIG. 3, an additional signal is drawn from the low pass filter 130 and the relative gains at the VCO 140 for each signal from the low pass filter 130 is altered accordingly. Thus, the VCO 140 includes two gain stages 310 and 320 as represented conceptually in FIG. 3. Instead of one gain (as was shown in FIG. 2), the VCO 140 includes a first gain stage 310 with a gain equal to K/M where M is a scaling factor. Further, the VCO 140 includes a second gain stage 320 with a gain equal to K*(M−1)/M. The resulting signals from these gain stages 310 and 320 may then be summed at a summing bus 330 before sending to the input of a CCO 335. The output of the CCO 335 is coupled back to the frequency divider.

Thus, in FIG. 3, the low pass filter 130 having the first capacitor 301 (with a value of C2) in parallel with the second capacitor 302 (having a value of C1) and resistor 303 (having a value of R1), may again have the same transfer function H(s) at node 207:

$$H(s)_{205}=(1+sR1C1)/(s(C1+C2+sR1C1C2)).$$

However, a different transfer function from interim node 309 becomes:

$$H(s)_{309} \approx 1/(s(C1+C2+sR1C1C2)).$$

The signal at node 205 (i.e., $H(s)_{205}$ may be coupled to a voltage-to-current converter (not shown until FIG. 4) to yield a first gain. Similarly, the signal at node 309 (i.e., $H(s)_{309}$ may be coupled to a voltage-to-current converter (also not shown until FIG. 4) to yield a second gain. Further, because of the two gain stages in the VCO, the gains may be adjusted according to need (as discussed further below) using a scaling factor of M. Therefore, the first gain here may be set to K/M and the second gain may be set to K*(M−1)/M. This results in an overall transfer function of:

$$H(s)=(1+sR1C1)/(s(C1+C2+sR1C1C2))*K/M+1/(s(C1+C2+sR1C1C2))*K(M-1)/M.$$

This transfer function simplifies to:

$$H(s)=(1+sR1C1/M)/(s(C1+C2+sR1C1C2))*K.$$

In order to maintain loop stability and filtering with the introduction of the different gain stages 310 and 320, one may also adjust the values of the components in the low pass filter 130. Thus, the resistor 303 may be multiplied by the scaling factor M and the first capacitor 301 may be divided by the scaling factor M. Designating these new components values as scaled by M with a prime symbol, the overall transfer function becomes:

$$H(s)=(1+sR1'C1'/M)/(s(C1'+C2'+sR1'C1'C2'))*K.$$

where R1' may be the new resistor value scaled according to an embodiment described below. C1' and C2' are also, likewise, scaled by some scaling factor or mathematical variation thereof (e.g., squared, Sq, root, etc.) Applying R1'=R1*M and C2'=C2/M, the transfer function becomes:

$$H(s)=((1+sR1C1)/(s(C1+(C2/M)+sR1C1C2)))*K$$

In any PLL, typically C1>>C2 for the aforementioned purposes of stability and jitter filtering. With the new transfer function, one realizes that the poles and zeros for the above transfer function are same as original transfer function such that stability of the PLL remain. However, thermal noise of the resistor 303 in the circuit design of FIG. 3 is reduced. Recall that is FIG. 2, the thermal noise from the resistor 203 was equal to =4kTR1. Applying the one gain stage of the VCO 140, this noise was multiplied by K resulting in noise equal to 4kTR1*K². Advantageously, as R1'=R1*M, thermal noise of the resistor 303 of FIG. 3 is equal to 4kTR1*M. Then, the part of the VCO gain that multiplies this noise, as shown in FIG. 3 is K/M. Thus, total jitter from thermal noise of the resistor 303 is proportional to 4kTR1M*(K/M)² which simplifies to 4kTR1*K²/M. Hence, the jitter due to resistor 303 thermal noise is reduced by a factor of M.

Figure 4:
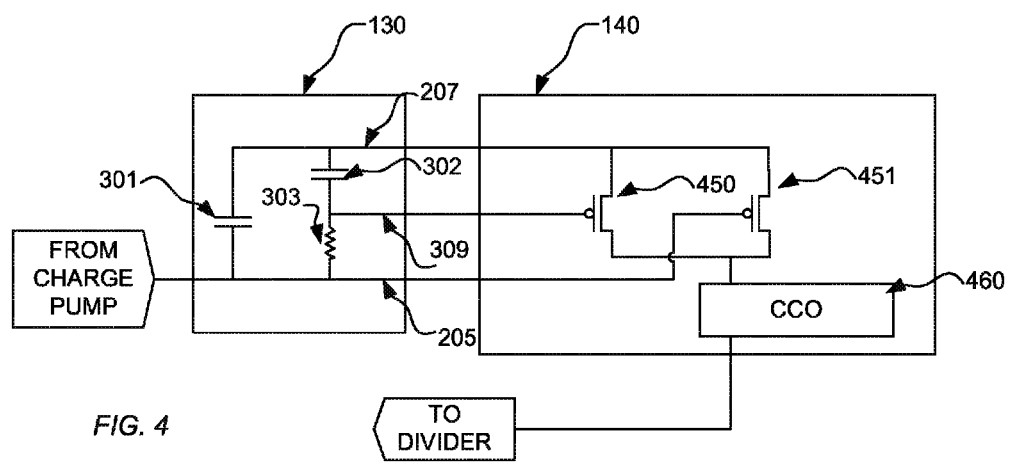
FIG. 4 is a more detailed circuit diagram of a low pass filter and VCO from FIG. 1 of a phase locked loop circuit having an effect of reduced jitter due to thermal noise of resistor in the low pass filter according to an embodiment of the subject matter disclosed herein.

Thus, the scaling factor M, may be set to a desired value, typically between 2 and 10, in order to provide sufficient reduction in thermal noise. FIG. 4 and the discussion that follows delves further into the advantages evident in these embodiments.

FIG. 4 is a more detailed circuit diagram of a low pass filter block from FIG. 1 of a phase locked loop circuit 100 having an effect of reduced jitter according to an embodiment of the subject matter disclosed herein. In the embodiment of FIG. 4, a more detailed schematic of the voltage-to-current converters 450 and 451 are show wherein an additional signal is drawn from the low pass filter 130 and the relative gains at the VCO 140 for each signal from the low pass filter 130 is altered accordingly. Thus, the VCO 140 includes two gain stages 310 and 320 (as shown in FIG. 3) represented as elements 450 and 451. Again, instead of one gain (as was shown in FIG. 2), the VCO 140 includes a first gain equal to K/M (which corresponds to the voltage-to-current converter 451) and a second gain equal to K*(M−1)/M (which corresponds to a second voltage-to-current converter 450).

Thus, in FIG. 4, the low pass filter 130 having the first capacitor 301 (with a value of C2) in parallel with the second capacitor 302 (having a value of C1) and resistor 303 (having a value of R1), may again be scaled by the scaling factor M as described above. With the gains as detailed, the overall transfer function for the circuit remains:

$$H(s)=(1+sR1'C1'/M)/(s(C1'+C2'+sR1'C1'C2'))*K.$$

As can be seen, the voltage-to-current converter 450 includes a first conduction node coupled to the node 207 and a control node coupled to the interim node 309. Further, the voltage-to-current converter 451 also includes a first conduction node coupled to the node 207, but this voltage-to-current converter's control node is coupled to the signal node 205 of the low pass filter 130. Each voltage-to-current converter 450 and 451 also includes a second conduction node coupled to each other and to the CCO 460 of the VCO 140.

With the low pass filter 130 and VCO 140 of FIGS. 3 and 4, several advantages are evident. By selecting a scaling factor M greater than one, the gain stage that amplifies the portion of the signal passing through the resistor 303 is reduced by the scaling factor M. Per the equation discussed above, noise due to thermal noise of the resistor 303 is proportional to 4kTR*(K/M)2. Therefore, when M>1, this results in a reduction in thermal noise contribution due the resistor 303, by a factor proportional to 1/M.

In one embodiment, the scaling factor is equal to five. Thus, R1'=5R1, C1'=C1, and C2'=C2/5. Thus, in this embodiment (as compared to the low-pass filter 130 described above with respect to FIG. 2), the resistor 303 is 10,000 ohms, the first capacitor 301 is 4 pF and the second capacitor 302 is 200 pF. As such, the jitter due to the thermal noise caused by current flowing through the resistor 303 is reduced by a factor of 5.

In another embodiment, the scaling factor is equal to ten. Thus, R1'=10R1, C1'=C1, and C2'=C2/10. In this embodiment (as compared to the low-pass filter 130 described above with respect to FIG. 2), the resistor 303 is 20,000 ohms, the first capacitor 301 is 2 pF and the second capacitor 302 is 200 pF. As such, the thermal noise caused by current flowing through the resistor 303 is reduced by a factor of 10.

With that, an alternate configuration can be applied to have additional advantages. One additional advantage is the reduction in space requirements for the two capacitors 301 and 302. Thus, in this embodiment, R1 (i.e., the resistor 303) is multiplied by $M^2$, C1 (i.e., the capacitor 302) is divided by M and C2 (i.e., the capacitor 301) is divided by $M^2$ For such an embodiment to maintain the original poles and zeros as well as open loop gain of the PLL of FIG. 2, the charge pump gain may also to be reduced by a factor of M. In this case, the space taken by the capacitors is reduced while having no additional jitter due to increased size of the LPF resistor 303.

Generally speaking, increasing the size of the resistor 303 does not increase the used space for componentry as fast as reducing the capacitors do. With M=5, assuming C1=200 pF, C1' will be 40 pF, and, thus, 160 pF of capacitor space is saved. By comparison, an increase of up to 25 times the resistance value for the resistor 303 will increase an area equivalent to a mere 10 pF of capacitor space. Thus, in an example where M=5, at least 66% of the component space is saved in low pass filter 130 area. In most PLL circuits, the low pass filter 130 comprises about 50% of the total area of the entire PLL circuit 100. With M=10 (which can be easily kept in a stable design), the area saving may be even higher.

In yet another embodiment, one may optimize jitter reduction with area reduction. Such an optimization may be reached when a constant scaling factor of any value between M and $M^2$ (for the resistor) and a corresponding scaling factor for the two capacitors and charge pump gain. This corresponding scaling factor is calculated to maintain the poles and zeroes of the reference design of FIG. 2. One example of this optimized design is having R1'=M*sq.rooot(M)*R1, C2'=C2/M, and C1'=C1/sq.root(M), and charge pump gain being divided by sq.root(M).

Figure 5:
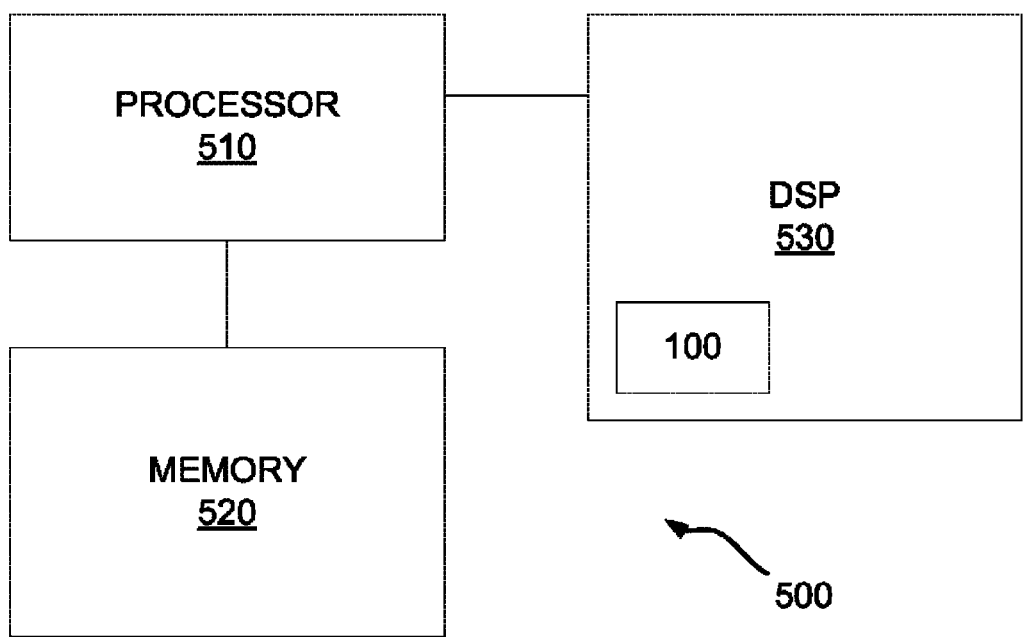
FIG. 5 is a block diagram of an embodiment of a system having the circuit of FIGS. 1-4 according to an embodiment of the subject matter disclosed herein.

FIG. 5 is a block diagram of an embodiment of a system 500 having the circuit of FIGS. 1-4 according to an embodiment of the subject matter disclosed herein. The system 500 includes the PLL circuit 100 that may be part of an integrated circuit, such as a digital signal processing (DSP) circuit 530. The DSP circuit 530 may be implemented as a single integrated circuit disposed on a single die or may be disposed on multiple integrated circuit dies. Further, the DSP circuit 530 may be coupled to controller or processor 510 which may retrieve data from and store data to a memory 520.

While the subject matter discussed herein is susceptible to various modifications and alternative constructions, certain illustrated embodiments thereof are shown in the drawings and have been described above in detail. It should be understood, however, that there is no intention to limit the claims to the specific forms disclosed, but on the contrary, the intention is to cover all modifications, alternative constructions, and equivalents falling within the spirit and scope of the claims.

What is claimed is:

1. A circuit, comprising:
a filter configured to produce a first filtered signal and a second filtered signal; and
an oscillator coupled to the filter and configured to modify the first filtered signal in a manner that is different from modifying the second filtered signal, the difference including a scaling factor.

2. The circuit of claim 1, wherein the filter comprises:
a low pass filter having:
a first capacitor in series with a resistor; and
a second capacitor in parallel with the first capacitor and resistor.

3. The circuit of claim 2, wherein the first capacitor is larger than the second capacitor.

4. A circuit, comprisinq:
a filter configured to produce a first filtered signal and a second filtered signal; and
an oscillator coupled to the filter and configured to modify the first filtered signal in a manner that is different from modifying the second filtered signal;
wherein the filter comprises:
a low pass filter having:
a first capacitor in series with a resistor; and
a second capacitor in parallel with the first capacitor and resistor; and
wherein the values of the first capacitor and resistor are scaled by a factor such that the first capacitor is reduced by the factor and the resistor is increased by the factor.

5. The circuit of claim 4, wherein the factor comprises a factor of five.

6. The circuit of claim 4, wherein the factor comprises a factor of ten.

7. The circuit of claim 4, wherein the factor comprises a factor of the square root of two.

8. A circuit, comprising:
a filter configured to produce a first filtered signal and a second filtered signal; and
an oscillator coupled to the filter and configured to modify the first filtered signal in a manner that is different from modifying the second filtered signal;
wherein the filter comprises:
a low pass filter having:
a first capacitor in series with a resistor; and
a second capacitor in parallel with the first capacitor and resistor; and
wherein the values of the first capacitor and resistor are scaled by a factor such that the first capacitor is reduced by the factor and the resistor is increased by an exponential power of two of the factor.

9. A circuit, comprising:
a filter configured to produce a first filtered signal and a second filtered signal; and
an oscillator coupled to the filter and configured to modify the first filtered signal in a manner that is different from modifying the second filtered signal;
wherein the filter comprises:
a low pass filter having:
a first capacitor in series with a resistor; and
a second capacitor in parallel with the first capacitor and resistor; and
wherein the values of the first capacitor and resistor are scaled by a factor such that the first and second capacitors are reduced by the factor and the resistor is increased by an amount equal to a square root of the factor times the factor.

10. The circuit of claim 1, wherein the oscillator comprises a voltage controlled oscillator.

11. A circuit, comprisinq:
a filter configured to produce a first filtered signal and a second filtered signal; and
an oscillator coupled to the filter and configured to modify the first filtered signal in a manner that is different from modifyinq the second filtered signal;
wherein the filter and the oscillator comprise a transfer function of $H(s)=(1+sR1C1/M)/(s(C1+C2+sR1C1C2))*K$, where s comprises a frequency of a signal, R1 comprises the resistance of a resistor, C1 comprises the capacitance of a first capacitor, C2 comprises the capacitance of a second capacitor, M comprising a scaling factor and K comprises a gain.

12. A phase-locked loop, comprising:
a phase detector;
a charge pump coupled to the phase detector;
a low pass filter coupled to the charge pump;

an oscillator configured to receive a first control signal from the low pass filter and a second control signal from the low pass filter, the first control signal having a magnitude that is different by a scaling factor from the magnitude of the second control signal; and a feedback circuit coupled to the oscillator.

13. The phase-locked loop of claim 12, wherein the feedback circuit comprises a frequency divider circuit.

14. The phase-locked loop of claim 12, wherein the low pass filter is configured to provide the first and second control signals to the oscillator with limited jitter from thermal noise from a resistor.

15. An integrated circuit, comprising:
a filter having a resistor and a capacitor coupled to a first node
an oscillator having a first voltage-to-current converter having a first gain and a second voltage-to-current converter having a second gain related to the first gain by a scaling factor, the first voltage-to-current converter having a control node coupled to the first node.

16. The integrated circuit of claim 15, wherein the second voltage-to-current converter comprises a control node coupled to the capacitor.

17. The integrated circuit of claim 15 disposed on a single integrated circuit die.

18. The integrated circuit of claim 15 disposed on a multiple integrated circuit dies.

19. A system, comprising:
a digital signal processor having a phase locked loop, comprising:
a phase detector;
a charge pump coupled to the phase detector;
a low pass filter coupled to the charge pump;
an oscillator configured to receive a first control signal from the low pass filter and a second control signal from the low pass filter, the first control signal having a magnitude that is different by a scaling factor from the magnitude of the second control signal; and
a feedback circuit coupled to the oscillator.

20. The system of claim 19, further comprising a processor coupled to the digital signal processor.

21. The system of claim 19, further comprising a memory coupled to the digital signal processor.

22. A method, comprising:
filtering a signal such that a first filtered control signal and a second filtered control signal are generated, the first filtered control signal related to the second filtered control signal by a scaling factor; and
generating an oscillating signal based on the first filtered control signal and the second filtered control signal.

23. The method of claim 22, wherein the first filtered signal is amplified by a first gain and the second filtered signal is amplified by a second gain.

24. The method of claim 23, wherein the first gain comprises a gain factor divided by the scaling factor and the second gain comprises the gain factor multiplied by a quotient of the scaling factor minus one and the scaling factor.

25. A method, comprising:
generating a control signal for adjusting a phase of a signal in a phase-locked loop; and
applying a transfer function to the control signal of $H(s) = (1+sR1C1/M)/(s(C1+C2+sR1C1C2))*K$, where s comprises a frequency of a signal, R1 comprises the resistance of a resistor, C1 comprises the capacitance of a first capacitor, C2 comprises the capacitance of a second capacitor, M comprising a scaling factor and K comprises a gain.

* * * * *

UNITED STATES PATENT AND TRADEMARK OFFICE
CERTIFICATE OF CORRECTION

PATENT NO. : 8,803,572 B2
APPLICATION NO. : 13/547742
DATED : August 12, 2014
INVENTOR(S) : Anand Kumar et al.

It is certified that error appears in the above-identified patent and that said Letters Patent is hereby corrected as shown below:

In the Claims

Column 7, line 65, the phrase "A circuit, comprisinq" should read --A circuit, comprising--

Column 8, line 51, the phrase "A circuit, comprisinq" should read --A circuit, comprising--

Column 8, line 56, the phrase "modifyinq the second filtered signal;" should read --modifying the second filtered signal--

Signed and Sealed this
Ninth Day of December, 2014

Michelle K. Lee
*Deputy Director of the United States Patent and Trademark Office*